(12) United States Patent
Chen

(10) Patent No.: US 10,043,669 B2
(45) Date of Patent: Aug. 7, 2018

(54) METHOD FOR FABRICATING METAL GATE STRUCTURE

(71) Applicant: UNITED MICROELECTRONICS CORP., Hsin-Chu (TW)

(72) Inventor: Shao-Ping Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/412,066

(22) Filed: Jan. 23, 2017

(65) Prior Publication Data

US 2018/0190499 A1  Jul. 5, 2018

(30) Foreign Application Priority Data

Jan. 5, 2017  (TW) ............................. 106100269 A

(51) Int. Cl.

| H01L 21/336 | (2006.01) |
|---|---|
| H01L 29/165 | (2006.01) |
| H01L 21/28 | (2006.01) |
| H01L 29/49 | (2006.01) |
| H01L 21/22 | (2006.01) |
| H01L 21/38 | (2006.01) |
| H01L 29/51 | (2006.01) |
| H01L 21/02 | (2006.01) |

(52) U.S. Cl.
CPC .. H01L 21/28185 (2013.01); H01L 21/28088 (2013.01); H01L 29/4966 (2013.01); *H01L 21/02326* (2013.01); *H01L 29/495* (2013.01); *H01L 29/515* (2013.01); *H01L 29/517* (2013.01); *H01L 29/518* (2013.01)

(58) Field of Classification Search
CPC ...... H01L 21/02323–21/02326; H01L 21/283; H01L 21/321; H01L 21/324; H01L 21/28211–21/28238; H01L 21/02068; H01L 29/517; H01L 29/4916–29/4925; H01L 29/495; H01L 29/4966; H01L 29/515; H01L 29/518

See application file for complete search history.

(56) References Cited

U.S. PATENT DOCUMENTS

| 5,604,140 | A | * | 2/1997 | Byun | ................ H01L 21/28061 |
|---|---|---|---|---|---|
| | | | | | 257/E21.2 |
| 5,854,499 | A | * | 12/1998 | Nishioka | ................ H01L 28/55 |
| | | | | | 257/295 |
| 5,903,053 | A | * | 5/1999 | Iijima | ..................... H01L 29/45 |
| | | | | | 257/751 |
| 6,054,331 | A | * | 4/2000 | Woo | ...................... C23C 14/165 |
| | | | | | 438/3 |
| 6,217,721 | B1 | * | 4/2001 | Xu | ...................... C23C 14/0036 |
| | | | | | 204/192.15 |

(Continued)

*Primary Examiner* — Maliheh Malek
(74) *Attorney, Agent, or Firm* — Winston Hsu

(57) ABSTRACT

A method for fabricating a metal gate structure includes following steps. A substrate is provided and followed by forming a high-K dielectric layer on the substrate. Then, an oxygen-containing titanium nitride layer is formed on the high-K dielectric layer. Next, an amorphous silicon layer is formed on the oxygen-containing titanium nitride layer and followed by performing an annealing process to drive oxygen in the oxygen-containing titanium nitride layer to the high-K dielectric layer.

13 Claims, 5 Drawing Sheets

(56) References Cited

U.S. PATENT DOCUMENTS

| | | | |
|---|---|---|---|
| 6,737,716 B1* | 5/2004 | Matsuo | H01L 21/28185 257/406 |
| 7,074,680 B2 | 7/2006 | Doczy | |
| 7,531,404 B2 | 5/2009 | Pae | |
| 9,059,313 B2* | 6/2015 | Wong | H01L 21/823842 |
| 9,269,785 B2* | 2/2016 | Mueller | G11C 11/22 |
| 9,356,125 B1* | 5/2016 | Hsiao | H01L 29/0653 |
| 9,418,853 B1* | 8/2016 | Wang | H01L 21/28185 |
| 9,524,967 B1* | 12/2016 | Liu | H01L 27/088 |
| 9,559,016 B1* | 1/2017 | Bao | H01L 21/823842 |
| 9,583,400 B1* | 2/2017 | Bao | H01L 21/823842 |
| 9,741,720 B1* | 8/2017 | Siddiqui | H01L 27/0924 |
| 9,837,504 B2* | 12/2017 | Chen | H01L 29/4966 |
| 9,859,169 B2* | 1/2018 | Bao | H01L 21/823842 |
| 9,887,158 B1* | 2/2018 | Li | H01L 23/53266 |
| 9,899,491 B2* | 2/2018 | Su | H01L 29/4966 |
| 2002/0072209 A1* | 6/2002 | Tseng | H01L 21/28061 438/592 |
| 2002/0164858 A1* | 11/2002 | Sayama | H01L 21/32137 438/283 |
| 2005/0127446 A1* | 6/2005 | Nakanishi | H01L 21/28035 257/358 |
| 2005/0269635 A1* | 12/2005 | Bojarczuk, Jr. | H01L 21/28079 257/338 |
| 2007/0045752 A1* | 3/2007 | Forbes | H01L 21/28114 257/387 |
| 2007/0187831 A1* | 8/2007 | Ahn | C23C 16/30 257/761 |
| 2009/0085175 A1* | 4/2009 | Clark | H01L 21/3141 257/637 |
| 2009/0181505 A1* | 7/2009 | Ando | H01L 21/28088 438/216 |
| 2009/0325372 A1* | 12/2009 | Harada | C23C 16/34 438/591 |
| 2010/0048010 A1* | 2/2010 | Chen | H01L 21/28185 438/591 |
| 2010/0127336 A1* | 5/2010 | Chambers | H01L 21/28088 257/369 |
| 2010/0155860 A1* | 6/2010 | Colombo | H01L 21/28079 257/412 |
| 2010/0187610 A1* | 7/2010 | Kwon | H01L 21/823807 257/369 |
| 2010/0221906 A1* | 9/2010 | Metzger | H01L 21/28088 438/591 |
| 2010/0248464 A1* | 9/2010 | Clark | H01L 21/28185 438/591 |
| 2011/0121399 A1* | 5/2011 | Park | H01L 21/823842 257/369 |
| 2011/0127590 A1* | 6/2011 | Binder | H01L 21/28088 257/288 |
| 2011/0151660 A1* | 6/2011 | Harada | C23C 16/34 438/652 |
| 2011/0169141 A1* | 7/2011 | Shepard, Jr. | H01L 21/02164 257/640 |
| 2012/0018810 A1* | 1/2012 | Chambers | H01L 21/28088 257/369 |
| 2012/0068261 A1* | 3/2012 | Kwon | H01L 21/823842 257/331 |
| 2012/0280288 A1* | 11/2012 | Ando | H01L 21/28176 257/288 |
| 2012/0315749 A1* | 12/2012 | Hempel | H01L 21/28176 438/591 |
| 2013/0052814 A1* | 2/2013 | Clark | H01L 21/823842 438/591 |
| 2013/0093064 A1* | 4/2013 | Lin | H01L 21/28185 257/637 |
| 2013/0196515 A1* | 8/2013 | Clark | H01L 21/28185 438/763 |
| 2013/0207203 A1* | 8/2013 | Tomimatsu | H01L 29/66477 257/411 |
| 2013/0264652 A1* | 10/2013 | Zhu | H01L 21/28088 257/369 |
| 2013/0277743 A1* | 10/2013 | Jagannathan | H01L 21/28211 257/347 |
| 2014/0015068 A1* | 1/2014 | Yang | H01L 29/495 257/412 |
| 2014/0099785 A1* | 4/2014 | Mujumdar | H01L 21/02697 438/591 |
| 2014/0110791 A1* | 4/2014 | Clark | H01L 21/823857 257/369 |
| 2014/0242790 A1* | 8/2014 | Harada | H01L 21/28008 438/592 |
| 2014/0264778 A1* | 9/2014 | Lim | H01L 21/28194 257/632 |
| 2014/0268993 A1* | 9/2014 | Chiang | G11C 13/0002 365/148 |
| 2014/0306273 A1* | 10/2014 | Ho | H01L 21/28088 257/288 |
| 2014/0363962 A1* | 12/2014 | Hou | H01L 29/517 438/591 |
| 2015/0129972 A1* | 5/2015 | Choi | H01L 21/823462 257/369 |
| 2015/0155365 A1* | 6/2015 | Lee | H01L 29/4966 257/412 |
| 2015/0214319 A1* | 7/2015 | Li | H01L 29/4966 257/288 |
| 2015/0255277 A1* | 9/2015 | Tong | H01L 29/785 257/288 |
| 2016/0093508 A1* | 3/2016 | Ogawa | C23C 16/455 438/476 |
| 2016/0233092 A1* | 8/2016 | Lin | H01L 21/28506 |
| 2016/0268388 A1* | 9/2016 | Itokawa | H01L 29/42332 |
| 2016/0307762 A1* | 10/2016 | Hwang | H01L 21/28176 |
| 2016/0336194 A1* | 11/2016 | Yeh | H01L 21/823821 |
| 2016/0351686 A1* | 12/2016 | Han | H01L 29/66545 |
| 2017/0148686 A1* | 5/2017 | Bao | H01L 21/823857 |
| 2017/0207093 A1* | 7/2017 | Ho | H01L 21/28088 |
| 2017/0222026 A1* | 8/2017 | Chen | H01L 29/66742 |
| 2018/0012811 A1* | 1/2018 | Li | H01L 21/76843 |
| 2018/0026035 A1* | 1/2018 | Bao | H01L 29/66545 |
| 2018/0047640 A1* | 2/2018 | Bao | H01L 27/0924 |
| 2018/0138125 A1* | 5/2018 | Li | H01L 21/76883 |

* cited by examiner

METHOD FOR FABRICATING METAL GATE STRUCTURE

BACKGROUND OF THE INVENTION

1. Field of the Invention

The present invention relates to a method for fabricating a metal gate structure, and more particularly, to a method for fabricating a metal gate structure to mitigate negative bias temperature instability (NBTI).

2. Description of the Prior Art

In conventional semiconductor technology, poly-silicon is used as a gate electrode so as to be widely applied in semiconductor devices, such as the metal-oxide-semiconductor (MOS) transistors. With the trend towards scaling down the size of the MOS transistor, conventional poly-silicon gates face problems such as inferior performances due to boron penetration and unavoidable depletion effect, which increases the equivalent thickness of the gate dielectric layer, reduces the gate capacitance, and worsens a driving ability of the device. Therefore, work function metals are used as a new gate material to replace the conventional poly-silicon gate to be worked with new high-K (HK) dielectric layer so as to prevent the above problems in this field.

However, when the semiconductor technology is scaled down to the nano-scale, the thickness of the HK dielectric layer is more and more thin. Accordingly, the work function metal gate structure gradually reaches its physical and electrical limits, and so reliability problem of negative bias temperature instability is more and more serious, thereby shrinking the lifetime of the semiconductor device.

SUMMARY OF THE INVENTION

It is therefore one of the objectives of the invention to provide a method for fabricating a metal gate structure to mitigate the NBTI and prolong the lifetime of the metal gate structure.

According to an embodiment of the present invention, a method for fabricating a metal gate structure is provided and includes following steps. A substrate is first provided and followed by forming a HK dielectric layer on the substrate. Next, an oxygen-containing titanium nitride layer is formed on the HK dielectric layer. Then, an amorphous silicon layer is formed on the oxygen-containing titanium nitride layer. Subsequently, an annealing process is performed to drive oxygen in the oxygen-containing titanium nitride layer into the HK dielectric layer.

In the fabricating method of the present invention, the oxygen content of the oxygen-containing titanium nitride layer can be reduced, and the oxygen content of the HK dielectric layer can be increased by driving oxygen in the oxygen-containing titanium nitride layer into the HK dielectric layer and the amorphous silicon layer. Thus, both quality of the oxygen-containing titanium nitride layer and quality of the HK dielectric layer can be raised, thereby mitigating the NBTI and prolonging the lifetime of the metal gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
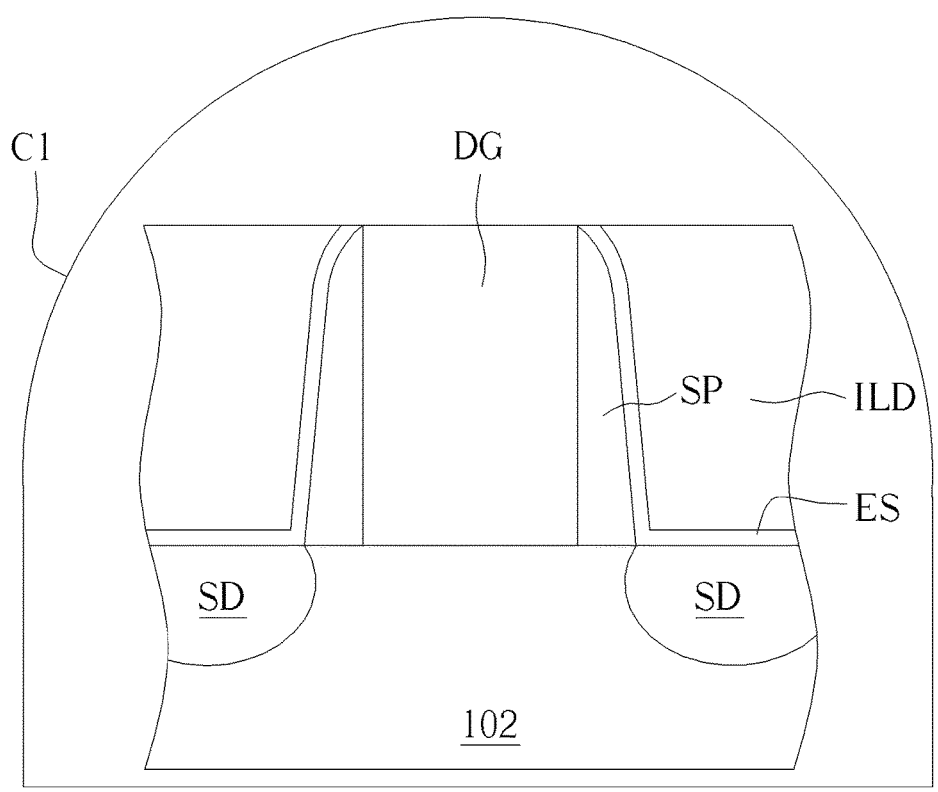
FIGS. 1A, 1B and 2-7 are schematic diagrams illustrating a method for fabricating a metal gate structure according to an embodiment of the present invention.
Figure 1B:
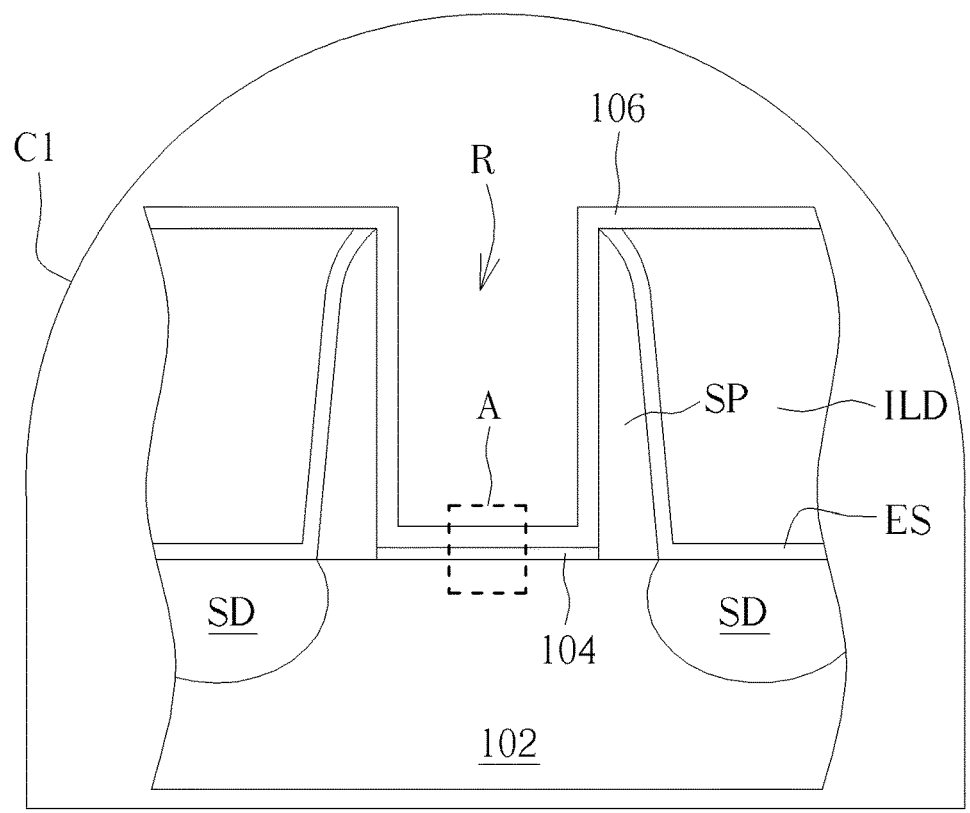

Refer to FIGS. 1A, 1B and 2-7, which are schematic diagrams illustrating a method for fabricating a metal gate structure according to an embodiment of the present invention, in which FIGS. 2-6 illustrate different steps corresponding to region A shown in FIG. 1B respectively. As shown in FIG. 1A, a substrate 102 is provided first, which includes a semiconductor substrate, such as a silicon substrate, a silicon-containing substrate, a III-V compound semiconductor on silicon substrate, such as GaN-on-silicon substrate, a graphene-on-silicon substrate or a silicon-on-insulator (SOI) substrate. In this embodiment, the substrate 102 may have a dummy gate DG, two spacers SP, an etching stop layer ES and inter-layer dielectric layer ILD formed thereon. For example, the substrate 102 may include a fin structure, but not limited thereto. As shown in FIG. 1B, after removing the dummy gate DG between the spacers SP, there is a recess R between the spacers SP which exposes the substrate 102. The dummy gate DG may include polysilicon or amorphous silicon. Furthermore, two source/drains SD may be disposed in the substrate 102 at two sides of the spacers SP. For example, recesses may be formed in the substrate 102 at two sides of the spacers SP and followed by forming epitaxial layers, such as silicon germanium, silicon carbon or silicon phosphorous epitaxial layer, in the recesses, or doped regions may be formed in the substrate 102 at two sides of the spacers SP. Afterward, an oxide layer 104 may be formed on the substrate 102 in the recess R by a thermal oxidation process or a chemical vapor deposition process. The oxide layer 104 may include for example silicon oxide. In another embodiment, the oxide layer 104 may be formed before the formation of the recess R.

Next, a deposition process is performed to forma HK dielectric layer 106 on the substrate 102. Specifically, the HK dielectric layer 106 conformally covers the inter-layer dielectric layer ILD and is formed on the oxide layer 104 and to cover the sidewall of the recess R. For example, the HK dielectric layer 106 may be a metal-containing dielectric layer, which may include hafnium oxide, zirconium oxide, but not limited thereto. Furthermore, the HK dielectric layer 106 may be selected from a group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). In this embodiment, the HK dielectric layer 106 may be a single-layer structure. In another embodiment, the HK dielectric layer 106 may also be a multi-layer structure. In a further embodiment, when the hafnium oxide layer is taken as an example, the HK dielectric layer 106 may be treated by a nitrogenizing process and nitrogenized to be a hafnium silicon oxynitride (HfSiOn) layer so as to increase its dielectric constant.

Figure 2:
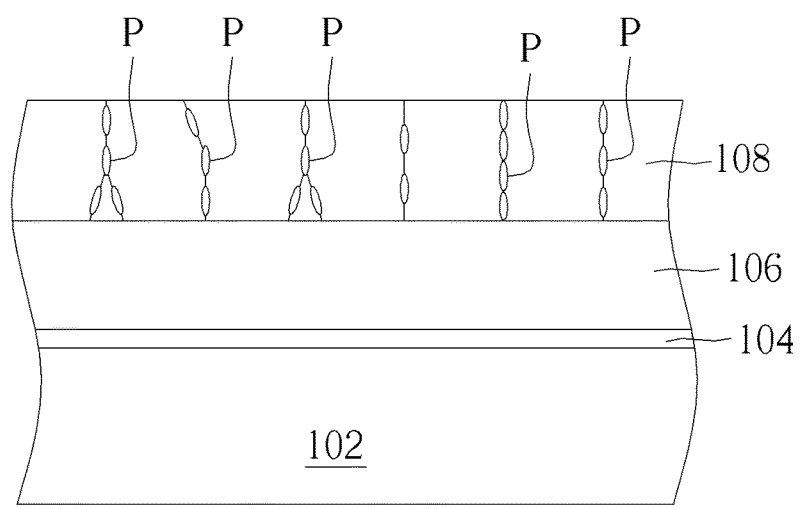

As shown in FIG. 2, after forming the HK dielectric layer 106, another deposition process is performed to form an oxygen-containing titanium nitride layer 108a on the HK dielectric layer 106. Specifically, the substrate 102 with the oxide layer 104 and the HK dielectric layer 106 formed thereon is disposed in a first chamber C1, so that the substrate 102 can be in a first sealed environment. For example, the first sealed environment may be a low pressure environment close to vacuum or in vacuum, but not limited thereto. Thereafter, in the first sealed environment, the deposition process is performed to form a titanium nitride layer 108 on the HK dielectric layer 106. Since the titanium nitride layer 108 has a pillar-shaped grain structure, there are lattice defects between the grain boundaries of the titanium nitride layer 108, and the titanium nitride layer 108 may include a plurality of pores P. In this time, the pores P of the titanium nitride layer 108 do not have oxygen filled therein.

Figure 3:
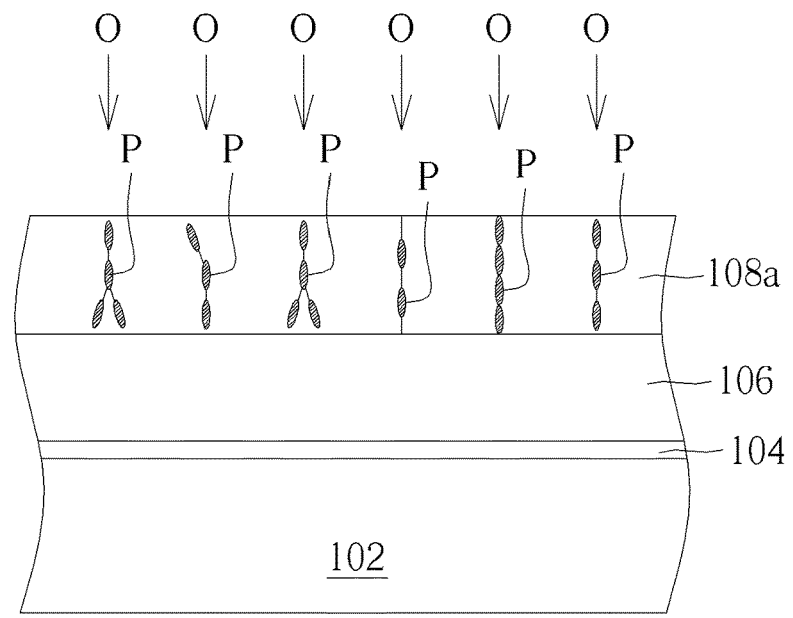

Subsequently, as shown in FIG. 3, the first sealed environment is removed to fill oxygen into the titanium nitride layer 108 so as to form the oxygen-containing titanium nitride layer 108a. Specifically, the step of filling oxygen into the titanium nitride layer 108 may include exposing the substrate 102 with the titanium nitride layer 108 formed thereon in an environment containing oxygen to drive oxygen into the titanium nitride layer 108. The step of exposing the substrate 102 in the environment containing oxygen may also mean disposing the titanium nitride layer 108 in an ex-situ environment different from the first sealed environment. For example, the first sealed environment may be broken by exposing the substrate 102 in air or disposing the substrate 102 in a sealed environment introducing oxygen without breaking vacuum, so that oxygen can be filled into the pores P of the titanium nitride layer 108 in this step.

Figure 4:
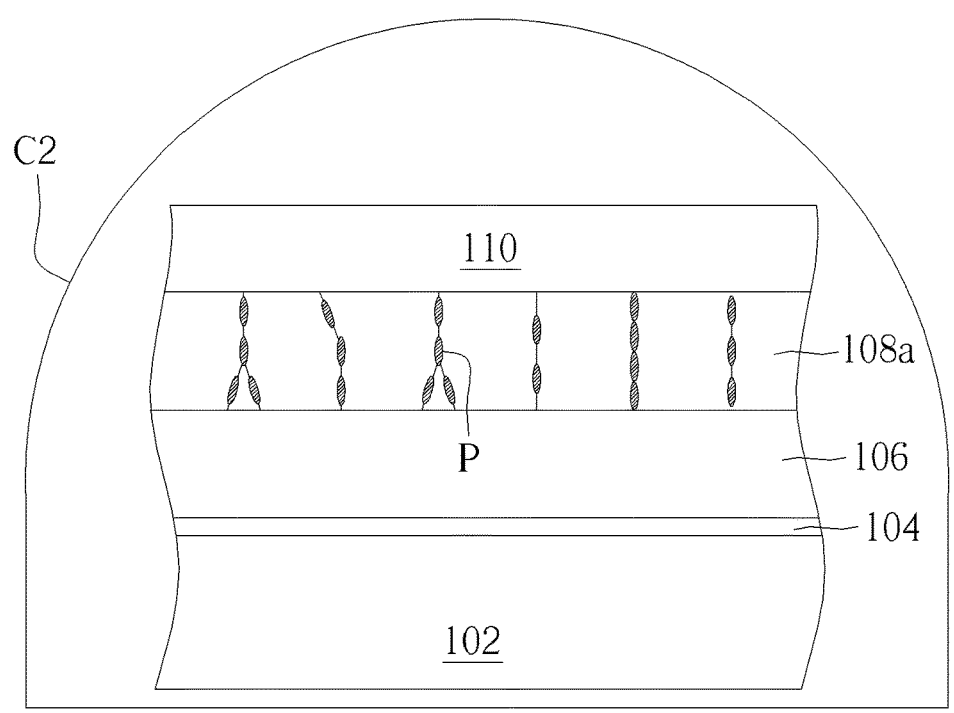

Afterward, as shown in FIG. 4, the substrate 102 with the oxygen-containing titanium nitride layer 108a formed thereon is disposed in a second chamber C2, so that the substrate 102 can be in a second sealed environment. Then, another deposition process is performed to form an amorphous silicon layer 110 on the oxygen-containing titanium nitride layer 108a and to cover the oxygen-containing titanium nitride layer 108a. Since the amorphous silicon layer 110 covers the oxygen-containing titanium nitride layer 108a, oxygen in the oxygen-containing titanium nitride layer 108a can be sealed between the amorphous silicon layer 110 and the HK dielectric layer 106. The second chamber C2 and the first chamber C1 may be in a same machine or different machines.

Figure 5:
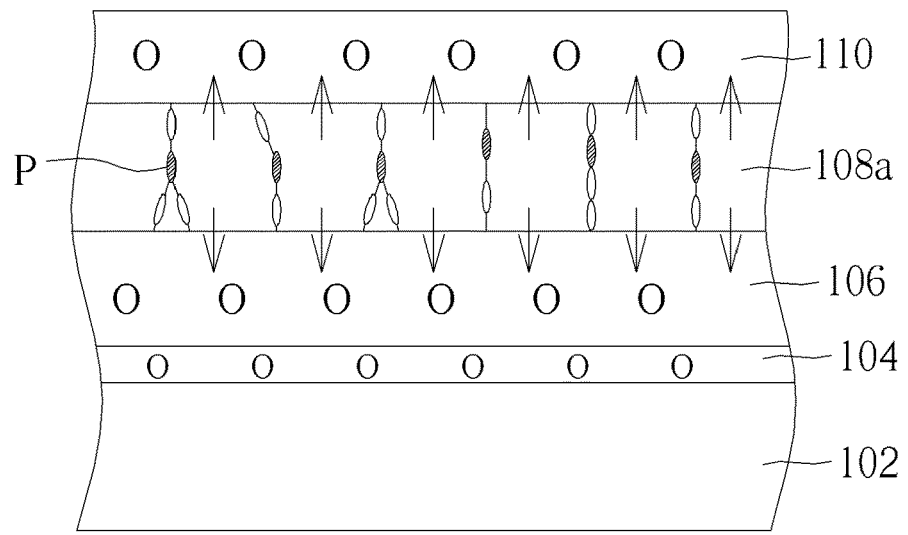

Then, as shown in FIG. 5, an annealing process is performed to drive oxygen in the pores P of the oxygen-containing titanium nitride layer 108a into the HK dielectric layer 106, and at the same time, oxygen in the pores P is also driven into the amorphous silicon layer 110 on the oxygen-containing titanium nitride layer 108a. It should be noted that since vacuum is broken after forming the titanium nitride layer 108 to let oxygen in air enter into the pores and affect the quality of the titanium nitride layer 108, the amorphous silicon layer 110 is formed and followed by performing the annealing process after forming the titanium nitride layer 108 in this embodiment, so that oxygen in the oxygen-containing titanium nitride layer 108a can be driven into the HK dielectric layer 106 and the amorphous silicon layer 110. Accordingly, not only oxygen content of the oxygen-containing titanium nitride layer 108a can be reduced, but also the oxygen content of the HK dielectric layer 106 can be increased, thereby raising both the quality of the oxygen-containing titanium nitride layer 108a and the quality of the HK dielectric layer 106. Besides, the annealing process may further drive oxygen in the oxygen-containing titanium nitride layer 108a into the oxide layer 104, and so the quality of the oxide layer 104 is also raised. For this reason, the interface trap and the hole trap can be reduced. Through driving oxygen into the HK dielectric layer 106 and the oxide layer 104 that serve as the gate insulation layer, film quality and film stability of the HK dielectric layer 106 and the oxide layer 104 can be improved. Thus, without altering thickness, the reliability of gate insulation layer can be increased, thereby mitigating the negative bias temperature instability and prolonging its lifetime. In this embodiment, the annealing process may be performed in a third sealed environment without oxygen. For example, the third sealed environment may be introduced with nitrogen gas or argon gas, and the duration of the annealing process may be about 10 sec to 5 min.

In this embodiment, for driving most of oxygen in the oxygen-containing titanium nitride layer 108a toward the HK dielectric layer 106 and the oxide layer 104 in the annealing process to largely improve their film qualities, the thickness of the amorphous silicon layer 110 may be less than 3 times of the thickness of the oxygen-containing titanium nitride layer 108a so as to force most of oxygen to move toward the HK dielectric layer 106 and the oxide layer 104. For example, the thickness of the oxygen-containing titanium nitride layer 108a may be ranged from 11.7 to 14.3 angstroms, and the thickness of the HK dielectric layer 106 may be ranged from 17 to 19 angstroms. Taking the HK dielectric layer formed of hafnium oxide as an example, when the thickness of the amorphous silicon layer 110 is 50 angstroms, percentages of the nitrogen content and the oxygen content in the HK dielectric layer 106 are respectively 28.76% and 71.24%, and when the thickness of the amorphous silicon layer 110 is reduced to be 30 angstroms, percentages of the nitrogen content and the oxygen content in the HK dielectric layer 106 are respectively 17.91% and 82.09%. From this, it can be seen that the decrease of the thickness of the amorphous silicon layer 110 can effectively drive oxygen toward the HK dielectric layer 106 and the oxide layer 104 so as to improve film quality. In another embodiment, the temperature of the annealing process may be greater than 930° C., preferably greater than 970° C.

Figure 6:
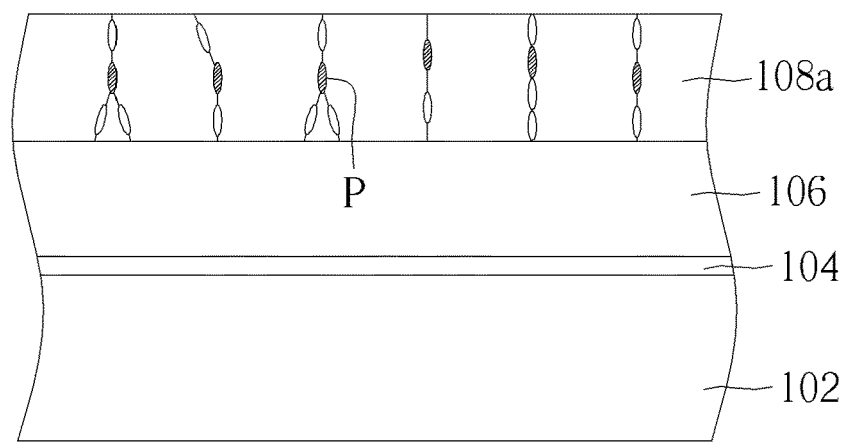

As shown in FIG. 6, after the annealing process, the amorphous silicon layer 110 is removed. Specifically, after a part of oxygen is driven to the amorphous silicon layer 110, oxygen in the amorphous silicon layer 110 may be prevented from returning to the oxygen-containing titanium nitride layer 108a in the following processes through removing the oxygen-containing amorphous silicon layer 110.

Figure 7:
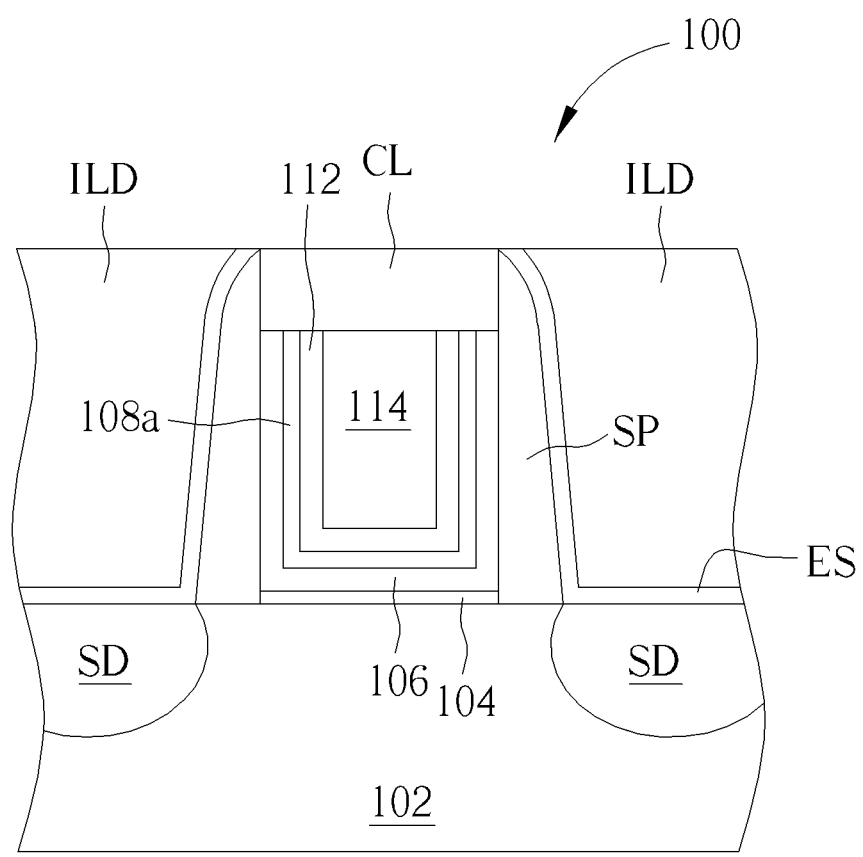

Following that, as shown in FIG. 7, a tantalum nitride layer 112 and a metal electrode layer 114 are sequentially formed on the oxygen-containing titanium nitride layer 108a to fill up the recess R. Then, a planarization process and an etching back process may be performed to remove the HK dielectric layer 106, the oxygen-containing titanium nitride layer 108a, the tantalum nitride layer 112 and the metal electrode layer 114 outside the recess R and a part of HK dielectric layer 106, apart of the oxygen-containing titanium nitride layer 108a, a part of tantalum nitride layer 112 and a part of metal electrode layer 114 inside the recess R. Afterward, a cap layer CL is formed to fill up the recess R to form a metal gate structure 100. The fabricating method of this embodiment is a gate last for HK last process, but the present invention is not limited thereto. In another embodiment, the HK dielectric layer 106 may also be formed before forming the recess, which means the method of the present invention may also be adapted to a gate-last for HK first process.

As the above-mentioned description, the fabricating method of the present invention drives oxygen in the oxygen-containing titanium nitride layer into the HK dielectric layer and the amorphous silicon layer through forming the amorphous silicon layer and performing the annealing process after forming the titanium nitride layer, so that not only the oxygen content of the oxygen-containing titanium nitride layer can be reduced, but also the oxygen content of the HK dielectric layer can be increased. Thus, both quality of the oxygen-containing titanium nitride layer and quality of the HK dielectric layer can be raised, thereby increasing the reliability of the gate insulation layer, mitigating the negative bias temperature instability and prolonging the lifetime of the metal gate structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a metal gate structure, comprising:
    providing a substrate;
    forming a dummy gate and two spacers on the substrate, wherein the dummy gate is disposed between the spacers;
    removing the dummy gate to form a recess between the spacers;
    forming a high-K dielectric layer in the recess and on the substrate;
    forming an oxygen-containing titanium nitride layer on the high-K dielectric layer in the recess;
    forming an amorphous silicon layer on the oxygen-containing titanium nitride layer in the recess; and
    performing an annealing process to drive oxygen in the oxygen-containing titanium nitride layer into the high-K dielectric layer and the amorphous silicon layer right after forming the amorphous silicon layer so as to reduce oxygen content of the oxygen-containing titanium nitride layer, wherein the annealing process is performed in a second sealed environment without oxygen.

2. The method for fabricating the metal gate structure according to claim 1, wherein the substrate further comprises providing an oxide layer on the substrate, and the annealing process drives oxygen in the oxygen-containing titanium nitride layer into the oxide layer.

3. The method for fabricating the metal gate structure according to claim 1, wherein forming the oxygen-containing titanium nitride layer comprises:
    forming a titanium nitride layer on the high-K dielectric layer in a first sealed environment; and
    removing the first sealed environment to fill oxygen into the titanium nitride layer to form the oxygen-containing titanium nitride layer.

4. The method for fabricating the metal gate structure according to claim 3, wherein the titanium nitride layer comprises a plurality of pores, and filling oxygen into the titanium nitride layer comprises filling oxygen into the pores.

5. The method for fabricating the metal gate structure according to claim 4, wherein the annealing process drives oxygen in the pores into the high-K dielectric layer and the amorphous silicon layer.

6. The method for fabricating the metal gate structure according to claim 3, wherein filling oxygen into the titanium nitride layer comprises exposing the titanium nitride layer in an oxygen-containing environment.

7. The method for fabricating the metal gate structure according to claim 1, wherein a thickness of the amorphous silicon layer is less than 30 angstroms.

8. The method for fabricating the metal gate structure according to claim 1, wherein a temperature of the annealing process is greater than 930° C.

9. The method for fabricating the metal gate structure according to claim 1, wherein the second sealed environment is introduced with nitrogen gas or argon gas.

10. The method for fabricating the metal gate structure according to claim 1, wherein a duration of the annealing process is ranged from 10 sec to 5 min.

11. The method for fabricating the metal gate structure according to claim 1, further comprising removing the amorphous silicon layer after the annealing process.

12. The method for fabricating the metal gate structure according to claim 11, further comprising sequentially forming a tantalum nitride layer and a metal electrode layer on the oxygen-containing titanium nitride layer.

13. The method for fabricating the metal gate structure according to claim 1, wherein a thickness of the amorphous silicon layer is less than 3 times of a thickness of the oxygen-containing titanium nitride layer.

* * * * *